(12) United States Patent
Sivacumarran

(10) Patent No.: US 6,727,652 B2
(45) Date of Patent: Apr. 27, 2004

(54) LAMPS

(75) Inventor: Karthigesu Sivacumarran, New Malden (GB)

(73) Assignee: Gamesman Limited, West Sussex (GB)

( * ) Notice: Subject to any disclaimer, the term of this patent is extended or adjusted under 35 U.S.C. 154(b) by 102 days.

(21) Appl. No.: 10/023,081

(22) Filed: Dec. 12, 2001

(65) Prior Publication Data

US 2003/0102820 A1 Jun. 5, 2003

(30) Foreign Application Priority Data

Dec. 21, 2000 (GB) .............................................. 0031227
May 23, 2001 (GB) .............................................. 0112537

(51) Int. Cl.$^7$ ................................................ H01J 13/46
(52) U.S. Cl. ...................... 315/58; 315/51; 315/185 S; 362/800; 362/806
(58) Field of Search ............................. 315/51, 56, 57, 315/58, 71, 185 S, 363; 362/800, 806

(56) References Cited

U.S. PATENT DOCUMENTS 5,121,311 A * 6/1992 Cheselske ................... 362/249
5,150,008 A * 9/1992 Lee ............................... 315/71
5,367,443 A * 11/1994 Hara ............................ 362/227
5,847,512 A * 12/1998 Baba et al. .................... 315/51

FOREIGN PATENT DOCUMENTS

FR          2576719          8/1986

* cited by examiner

Primary Examiner—Tan Ho
(74) Attorney, Agent, or Firm—Koppel, Jacobs, Patrick & Heybl; Michael J. Ram

(57) ABSTRACT

A lamp assembly, particularly for an entertainment machine, is made from one or more LEDs soldered to a printed circuit board (pcb). The pcb has an edge region with contacts which is constructed to fit into a lamp holder. The lamp assembly can be used in substitution for a conventional wedge-based push-fit bulb. The pcb edge region may be constructed so that it can only fit one way round in the lamp holder, or the pcb may include circuitry which allows connection either way round (either polarity).

15 Claims, 3 Drawing Sheets

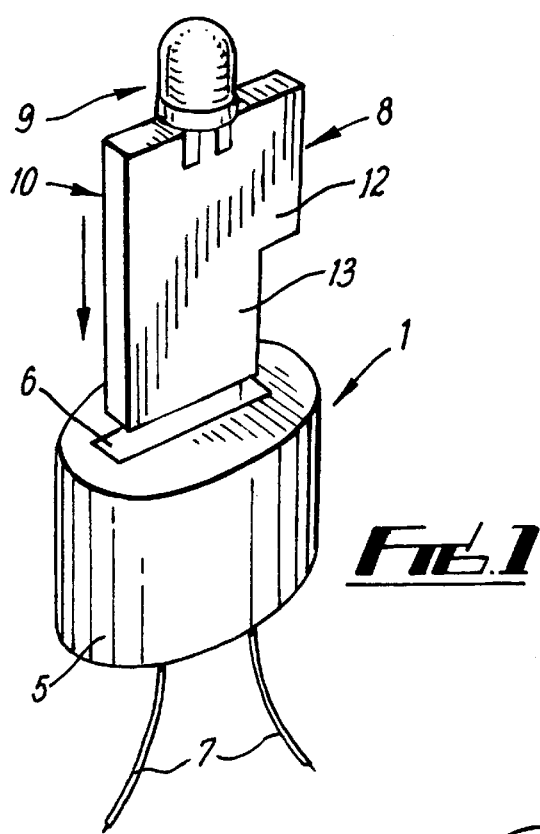
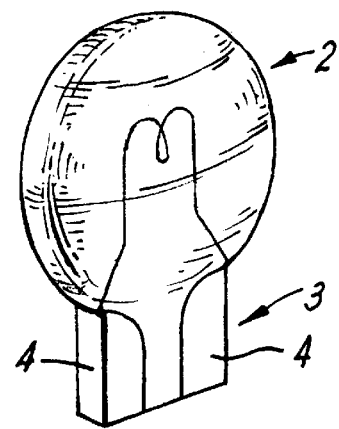
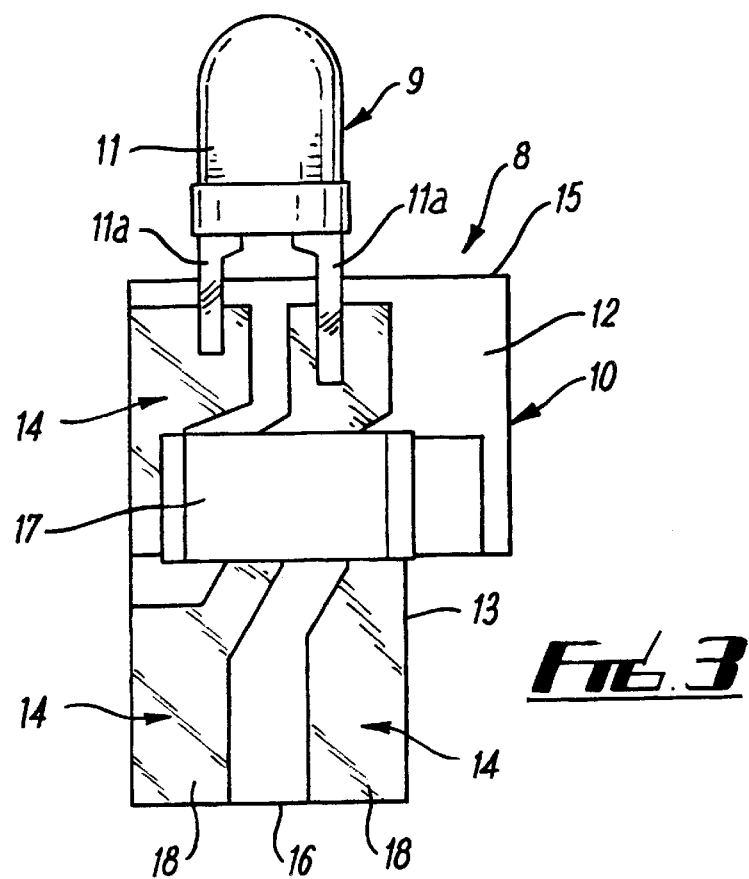

LAMPS

BACKGROUND OF THE INVENTION

This invention relates to lamps.

Multiple small lamps are used in entertainment machines of the coin-operated AWP (amusement with prizes), or SWP (skill with prizes) or gaming kind (referred to as fruit machine or poker machines or slot machines), for back illumination of transparent or translucent display structures such as front glass panels and press buttons.

Commonly these small lamps are filament bulbs of the kind having a shaped glass envelope with an integral flattened base part with externally exposed electrical conductors on the surface of the base part which communicate internally with the bulb filament. The base part is pushed into a dedicated lamp holder containing contacts which engage the conductors on the base part.

These known filament bulbs inevitably tend to fuse or otherwise fail and require replacement. This is generally inconvenient and, in so far as the attendance of maintenance personnel at the machine site is required, this may involve significant expense.

It is preferable to use alternative lamps such as light emitting diodes (LEDs) which are not so prone to failure but these are usually hard-wired onto printed circuit boards with associated components and therefore require some rewiring of the machine before they can be used in substitution for the known filament bulbs.

BRIEF SUMMARY OF THE INVENTION

An object of the present invention is to substitute a hard-wired lamp, such as an LED, for a filament bulb in electrical apparatus without necessarily requiring any rewiring of the apparatus.

According to the invention therefore there is provided a lamp assembly for use with a lamp holder having a receptacle containing electrical contacts to receive and support the base part of a lamp, which lamp assembly comprises at least one lamp having terminals projecting therefrom, and a circuit board having conductive pathways thereon, the lamp terminals being fixed to respective positions on the pathways so as to establish electrical contact therebetween and such that the lamp is physically supported by the circuit board, characterised in that the board has an edge region thereto for insertion into said lamp holder receptacle so as to be supported thereby, and said pathways include mutually spaced conductive portions at said edge region for conductive engagement with said contacts within said lamp holder receptacle.

With this arrangement the lamp assembly can be inserted into the lamp holder, in like manner to a conventional filament bulb, notwithstanding the use of a lamp of the hard-wired kind.

Preferably the lamp is an LED and the lamp terminals are projecting wires.

The lamp terminals are preferably soldered to the pathway positions, and the circuit board is preferably a printed circuit board.

The circuit board may also have affixed to the pathways, e.g. by soldering, one or more electrical components other than the (or each) lamp such as a resistor, diode, capacitor, fuse or any other suitable component.

The circuit board may be of any suitable shape. In a preferred embodiment the board is of generally rectangular shape with an extension or stepped part, preferably at an opposite side to the lamp, to provide the said end region.

Preferably, the board and the lamp holder are provided with means to influence, e.g. to facilitate or ensure, interconnection therebetween in a desired mode, such as a desired orientation and/or polarity of electrical connection.

Thus, for example, there may be cooperable configurations on the board and lamp holder which permit interconnection in the said mode but otherwise restrict or prevent interconnection.

The cooperable configurations may comprise an upward projection on the lamp holder and a transverse extension on the board whereby the projection is clear of the extension in the said mode but the extension engages the projection in the (or any) other mode.

The board may be presentable to the lamp holder for insertion therein two ways round, one way corresponding to the desired mode and the other way being an undesired mode.

In accordance with a further preferred embodiment, the board includes circuitry to enable the board to be connected to the lamp holder without requiring conformation to a desired mode, e.g. such that different polarizations of correction are possible. This arrangement may be used in place of the aforesaid arrangement to facilitate or ensure interconnection in a desired mode.

The circuitry may comprise a diode bridge arrangement which accommodates either of two opposite polarities of interconnections between the board and the lamp holder.

The lamp assembly of the invention is particularly suitable for use in an entertainment machine as mentioned above, although the invention is not necessarily restricted to this.

The lamp assembly may be used with two or more lamps fixed to the same board. In this case the lamps may be connected to be operated together or they may be independently controllable.

BRIEF DESCRIPTION OF THE DRAWINGS

The invention will now be described further by way of example only and with reference to the accompanying drawings in which:

FIG. 1 is a diagrammatic perspective view of one form of a lamp assembly according to the invention with a lamp holder;

FIG. 2 is a diagrammatic perspective view of a conventional lamp;

FIG. 3 is a plan view of the lamp assembly of FIG. 1;

FIG. 4 is a detailed view of parts of the pcb and lamp holder of FIGS. 1 to 3 and 1a;

DETAILED DESCRIPTION OF THE INVENTION

Figure 1A:
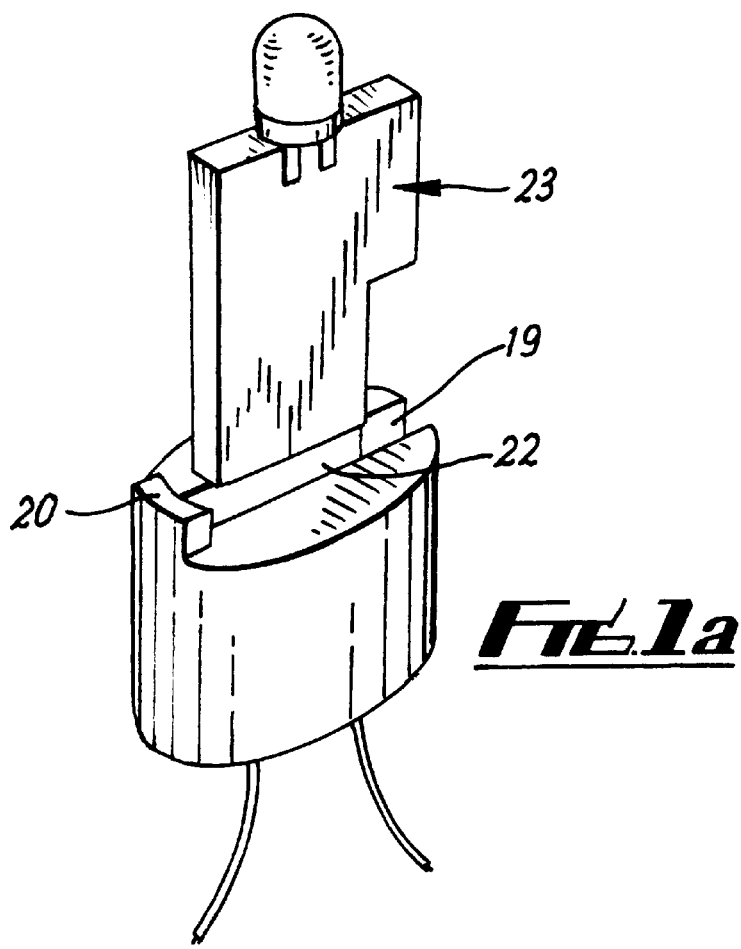
FIG. 1a is a view similar to FIG. 1 of a modified version.

Referring to the drawings, FIG. 1 shows a conventional lamp holder 1 as used with a conventional filament bulb 2 (FIG. 2) of the kind having an integral base part 3 of generally flattened rectangular form with conductors 4 at opposite side edges of the base part 3.

The lamp holder 1 comprises a moulded plastics body 5 with an open receptacle 6 of like shape to the above mentioned base part 3. Within this receptacle 6 there are electrical contacts which are connected to external leads 7.

The base part 4 of the bulb 2 can be inserted into the receptacle 6 so as to be supported and retained by the body 5 with the conductors 4 in engagement with the contacts within the receptacle 6.

FIG. 1 shows, as an alternative to the conventional bulb 2 of FIG. 2, a lamp assembly 8 comprising an LED 9 and a printed circuit board 10.

The LED 9 has a domed body part 11 with externally projecting trailing terminal wires 11a.

The printed circuit board 10 has a main rectangular body part 12 and, at one end an integral projecting extension part 13. This part 13 is of smaller width than the body part 12.

Conductive pathways 14 are established on the surface of the board 10 and these run from the top end 15 of the body part 12 to the bottom end 16 of the extension part 13.

The trailing wires 11a of the LED 9 are soldered to positions on respective pathways 14 adjacent to the top end 15. The LED 9 is thereby physically supported by the printed circuit board 10 and projects beyond the top end 15 of the board 10.

An associated electrical component 17, such as a resistor is soldered to further positions on the pathways 14.

The pathways 14 have enlarged regions or contact pads 18 within the extension part 13 contiguous with opposite side edge regions and the bottom end 16 of such part 13. As discussed hereinafter in relation to FIG. 4 the contact pads 18 may have parts which project outwardly or stand proud of the circuit board. Also the pads 18 may project on both sides of the board 10 to make contact with the usual pairs of terminals in the lamp holder 1 intended to grip therebetween the two sided contacts 4 of the conventional bulb 2.

The size and shape of the extension part 13 is essentially the same as that of the base part 3 of the conventional bulb 2 shown in FIG. 2 whereby the extension part 13 can be inserted into the receptacle 6 so as to support the lamp assembly 8 with the enlarged regions 18 of the pathways 14 conductively engaged by the contacts within the lamp holder 1.

With this arrangement the lamp assembly 8 can be used with the conventional lamp holder 1 in substitution for the conventional push-in wedge base filament bulb 2 without requiring any modification to the lamp holder 1.

This enables the use of a conventional LED 9 with the conventional lamp holder 1 in a convenient manner.

This arrangement finds particular application in the context of an entertainment machine as mentioned above.

Advantageously, the substitution of an LED lamp for a conventional push-in wedge base filament bulb gives long working life, low current consumption, low heat dissipation.

Figure 4:
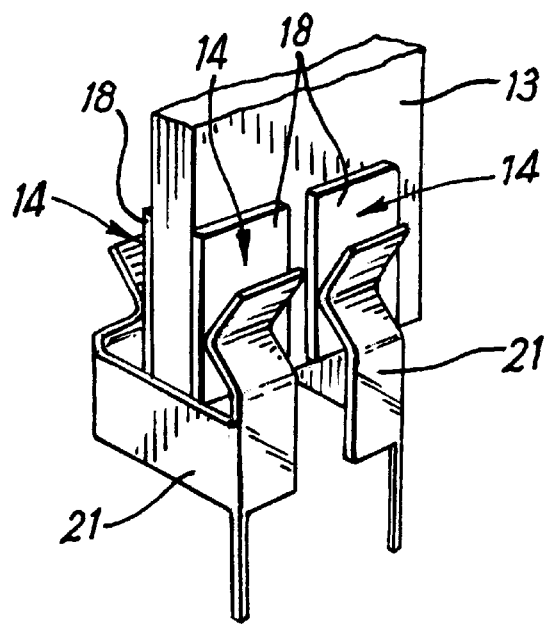

As shown in FIG. 4, the contact pads 18 on the pathways 14 engage between pairs of terminal contacts 21 within the conventional lamp holder 1. As indicated in FIG. 4, the pads 18 are positioned to align with the contacts 21. The right hand pad is thus shown with its outwardly projecting part spaced inwards from the right hand edge of the board extension.

As shown in the modified version of FIG. 1a, the lamp holder which has an open slot 22 to receive the narrow board part 13, has a recess or cut-away part 19 at one end of the slot, and a raised protrusion 20 at the other end.

The recess 19 and protrusion 20 co-act with the wider body part 12 of the board 10 which body part 12 defines a transverse projection 23 at one side.

It will be seen that full insertion of the pcb into the lamp holder in the orientation shown in FIG. 1a is possible because the projection 23 fits into the recess 19 and the protrusion 20 does not engage any part of the board 10. The pcb can therefore be inserted sufficiently to bring the pads 18 into engagement with the contacts 21.

On the other hand, if the pcb is inserted the other way round i.e. turned through 180° compared with the arrangement of FIG. 1a, full insertion is not possible because the projection will abut the protrusion 20. The pads 18 cannot therefore be pushed into engagement with the contacts 21.

It can therefore be ensured that the pcb and the lamp holder are always interengaged with a desired polarity.

Other 'keyway' constructions to ensure 'correct' interconnection of the board and the lamp holder are also possible.

Figure 5A:
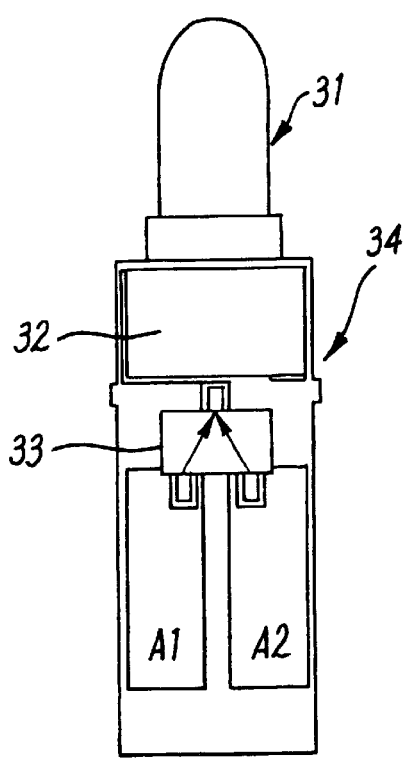
FIGS. 5a, 5b are front and back plan views of an alternative embodiment.
Figure 5B:
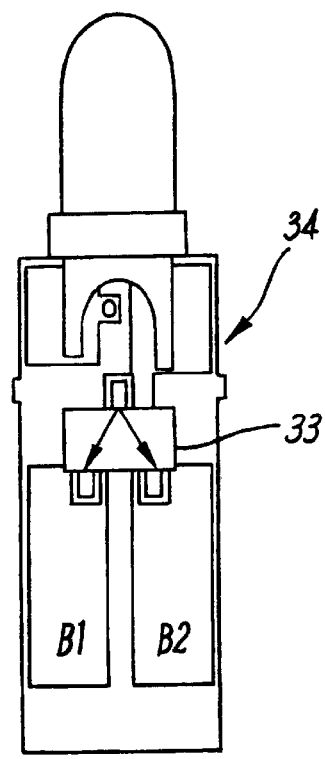
Figure 6:
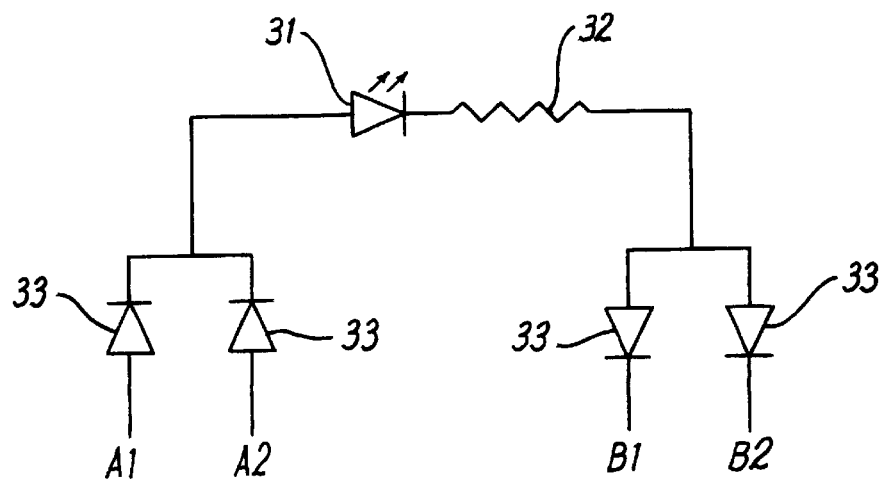
FIG. 6 is a circuit diagram of diode circuitry used in the embodiment of FIG. 5.

With the alternative embodiment of FIGS. 5 and 6, the LED 31 is soldered to a pcb 34 having conductive pads A1, A2 and B1, B2 on opposite sides of the pcb.

The pcb 34 is of elongate rectangular shape and does not have the stepped structure (parts 12, 13) of the pcb of FIGS. 1 to 3.

The pcb 34 has conductive pathways and a circuit including a resistor 32 and diodes 33 which define a network with separate connections to the pads A1, A2 and B1, B2.

With the arrangement of FIGS. 1 to 3 the pads 18 on one side of the pcb are connected directly to the pads 18 on the opposite side. It is necessary for the connection with the lamp holder to be the correct way round (correct polarity). If connection is made the wrong way round the LED voltage and current will be reverse biassed and the LED will fail to illuminate.

With the diode bridge network of FIG. 6 connection can be made either way round. The pcb can be inserted either way round. Also the electric supply to the lamp holder can be made either way round (either polarity).

It is of course to be understood that the invention is not intended to be restricted to the details of the above embodiment which are described by way of example only. Thus, for example, although only one LED is shown, two or more may be soldered to the same board. In this case the LEDs may be connected in parallel or otherwise linked so as to operate together. Alternatively, the LEDs may be separately connected to different circuits or to different parts of the same circuit so as to be independently controllable. In this latter respect there may be more than two contact pads 18 for cooperation with a corresponding number of contacts 21 so that the LEDs can be operated in different combinations depending on which contacts 21 have electrical power supplied thereto. Alternatively or additionally the arrangement may be such that the LEDs are differently operated in correspondence with different power characteristics (e.g. different polarity or voltage) applied to the contacts 21, e.g. by inserting the lamp assembly the other way round in the holder 1.

What is claimed is:

1. A lamp assembly for use with a lamp holder having a receptacle containing pairs of electrical contacts to receive and support the base part of a lamp, which lamp assembly comprises at least one lamp having terminals projecting therefrom, and a circuit board having conductive pathways thereon, the lamp terminals being fixed to respective positions on the pathways so as to establish electrical contact therebetween and such that the lamp is physically supported by the circuit board, wherein the board has an edge region thereto for insertion into said lamp holder receptacle so as to be supported thereby, and said pathways include mutually spaced conductive portions on both sides of the board at said edge region for conductive engagement respectively with said pairs of contacts within said lamp holder receptacle.

2. An assembly according to claim 1 wherein the lamp is an LED.

3. An assembly according to claim 2 wherein the lamp terminals are projecting wires.

4. An assembly according to claim 1 wherein the lamp terminals are soldered to the pathways.

5. An assembly according to claim 1 wherein the circuit board is a printed circuit board.

6. An assembly according to claim 1 wherein one or more electrical components, other than the (or each) lamp are also affixed to the pathways.

7. An assembly according to claim 1 wherein the board is generally rectangular with an extension providing the said edge region.

8. An assembly according to claim 1 wherein the board is provided with means for cooperation with the lamp holder to influence interconnection therebetween in a desired mode.

9. An assembly according to claim 8 wherein the desired mode is a polarity of electrical connection.

10. An assembly according to claim 8 wherein there are cooperable configurations on the board and lamp holder which permit interconnection in the said mode but otherwise restrict or prevent interconnection.

11. An assembly according to claim 10 wherein the cooperable configurations comprise an upward projection on the lamp holder and a transverse extension on the board whereby the projection is clear of the extension in the said mode but the extension engages the projection in the (or any) other mode.

12. An assembly according to claim 8 wherein the board is presentable to the lamp holder for insertion therein two ways round, one way corresponding to the desired mode and the other way being an undesired mode.

13. An assembly according to claim 1 wherein the board includes circuitry to enable the board to be connected to the lamp holder without requiring conformation to a desired mode.

14. An assembly according to claim 13 wherein the circuitry comprises a diode bridge arrangement which accommodates either of two opposite polarities of interconnections between the board and the lamp holder.

15. An assembly according to claim 1 wherein two or more lamps are connected to the same board and are arranged to be independently controllable.

* * * * *